United States Patent
Tachikawa et al.

(10) Patent No.: US 6,864,036 B2
(45) Date of Patent: Mar. 8, 2005

(54) NEGATIVE-WORKING PHOTORESIST COMPOSITION

(75) Inventors: Toshikazu Tachikawa, Yokohama (JP); Fumitake Kaneko, Kanagawa-ken (JP); Naotaka Kubota, Kanagawa-ken (JP); Miwa Miyairi, Kanagawa-ken (JP); Takako Hirosaki, Kanagawa-ken (JP); Koutaro Endo, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 110 days.

(21) Appl. No.: 10/053,622

(22) Filed: Jan. 24, 2002

(65) Prior Publication Data

US 2002/0061467 A1 May 23, 2002

Related U.S. Application Data

(63) Continuation-in-part of application No. 09/638,872, filed on Aug. 15, 2000, now Pat. No. 6,406,829.

(30) Foreign Application Priority Data

Aug. 20, 1999 (JP) .......................................... 11-234688

(51) Int. Cl.$^7$ .............................................. G03F 7/004
(52) U.S. Cl. .................................... 430/270.1; 430/905
(58) Field of Search .............................. 430/270.1, 905

(56) References Cited

U.S. PATENT DOCUMENTS

| | | | |
|---|---|---|---|
| 5,700,625 A | * 12/1997 | Sato et al. | ................ 430/270.1 |
| 5,928,837 A | 7/1999 | Sato et al. | |
| 6,010,829 A | 1/2000 | Rogers et al. | |
| 6,042,988 A | 3/2000 | Sato et al. | |
| 6,074,801 A | * 6/2000 | Iwasa et al. | ............. 430/270.1 |
| 6,319,853 B1 | * 11/2001 | Ishibashi et al. | ............ 438/780 |

FOREIGN PATENT DOCUMENTS

| | | |
|---|---|---|
| GB | 1 604 954 | 12/1981 |
| JP | 62-229942 | 10/1987 |
| JP | 1-293339 | 11/1989 |
| JP | 2-15270 | 1/1990 |
| JP | 2-120366 | 5/1990 |
| JP | 9-160259 | 6/1997 |
| KR | 198722 | 3/1999 |
| KR | 99-66776 | 8/1999 |

OTHER PUBLICATIONS

Iwasa et al., SPIE The International Society for Optical Engineering, 3333, pp. 417–424 (1998).

* cited by examiner

*Primary Examiner*—Rosemary Ashton
(74) *Attorney, Agent, or Firm*—Wenderoth, Lind & Ponack, LLP

(57) ABSTRACT

Disclosed is a novel negative-working chemical-amplification photoresist composition comprising (A) an alkali-soluble resin, (B) an acid-generating agent and (C) a crosslinking agent, of which the component (B) is an onium salt compound selected from the group consisting of iodonium salt compounds and sulfonium salt compounds, having a specific fluoroalkyl sulfonate ion as the anionic moiety and the component (C) is a specific ethyleneurea compound substituted for at least one nitrogen atom by a hydroxymethyl or alkoxymethyl group. The photoresist composition is particularly suitable for the formation of a photoresist layer on a substrate surface provided with an undercoating of a water-insoluble organic anti-reflection film exhibiting excellent pattern resolution and orthogonal cross sectional profile of the patterned resist layer with a good temperature latitude in the post-exposure baking treatment for latent image formation.

25 Claims, No Drawings

NEGATIVE-WORKING PHOTORESIST COMPOSITION

This is a continuation-in part application from a U.S. patent application Ser. No. 09/638,872 filed Aug. 15, 2000, now U.S. Pat. No. 6,406,829.

BACKGROUND OF THE INVENTION

The present invention relates to a novel and improved chemical-amplification negative-working photoresist composition suitable for the formation of a photoresist layer on an undercoating of an organic anti-reflection film on the surface of a substrate to give a patterned resist layer of high pattern resolution and having an excellently orthogonal cross sectional profile.

Along with the trend in recent years toward higher and higher degree of integration in various semiconductor devices, the photolithographically patterned resist layer on a substrate surface is required to have a pattern resolution of as fine as 250 nm or, as a target in the coming generation, as fine as 200 nm. Needless to say, such an extremely fine pattern resolution of the patterned resist layer cannot be accomplished without an innovative improvement in the performance of the photoresist composition which may be a chemical-amplification negative-working photoresist composition.

The above mentioned chemical-amplification negative-working photoresist composition is typically formulated with an acid-curable alkali-soluble resin such as a phenolic resin, a radiation-sensitive acid-generating agent and a crosslinking agent for the resin such as an addition product of urea or melamine and formaldehyde. While it is essential for the formation of a latent image of the pattern that the pattern-wise exposure of the photoresist layer to actinic rays is followed by a post-exposure baking (PEB) treatment, it is known that the line width of the patterned resist layer is influenced by the temperature of the PEB treatment.

When the temperature of the PEB treatment deviates out of a certain range, an appropriate line width of the patterned resist layer as desired can no longer be accomplished and the troubles thereby are more serious as the fineness of patterning is increased. Accordingly, it is eagerly desired to develop a negative-working photoresist composition of which the patterning process can be performed with a greatly increased temperature latitude for the PEB treatment or, namely, the line width of the patterned resist layer is little affected by an increase or decrease of the PEB temperature.

On the other hand, it is usual that a photoresist layer of a chemical-amplification negative-working photoresist composition is formed not directly on the surface of a substrate but on an undercoating layer of an anti-reflection film of an organic anti-reflection compound formed on the substrate surface in view of the advantage relative to the pattern resolution which can be as fine as 200 nm or even finer.

It is sometimes the case, however, that, when a conventional chemical-amplification negative-working photoresist composition is used in combination with an organic anti-reflection coating compound in the form of a solution such as the most typical commercial products of the DUV Series products (each a product by Brewer Science Co.), an excellently orthogonal cross sectional profile of the patterned resist layer can hardly be obtained and the cross sectional profile is more or less trapezoidal or skirt trailing. Accordingly, it is one of the target problems in the development works for negative-working photoresist compositions to obtain a chemical-amplification negative-working photoresist composition capable of being used in combination with an organic anti-reflection coating compound without being influenced in the pattern resolution and cross sectional profile of the patterned resist layer.

SUMMARY OF THE INVENTION

The present invention accordingly has an object, in view of the above described problems and disadvantages in the conventional negative-working photoresist composition, to provide a novel and improved negative-working photoresist composition capable of giving a photoresist layer on a substrate surface, which exhibits excellent pattern resolution in a wide range of temperature for the formation of a latent image by pattern-wise exposure of the photoresist layer to actinic rays even when used in combination with an organic anti-reflection film.

Thus, the present invention provides a negative-working photoresist composition which comprises, as a uniform solution in an organic solvent:

(A) 100 parts by weight of an alkali-soluble resin;

(B) from 0.5 to 20 parts by weight of an onium salt compound selected from the group consisting of iodonium salt compounds and sulfonium salt compounds, of which the anionic moiety is a fluoroalkyl sulfonate anion as a radiation-sensitive acid-generating agent; and (C) from 3 to 50 parts by weight of an ethyleneurea compound represented by the general formula

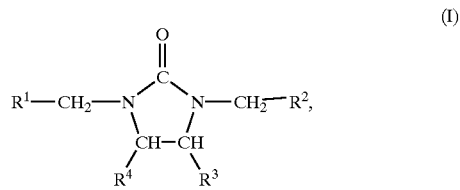

(I)

in which $R^1$ and $R^2$ are each a hydroxyl group or an alkoxy group having 1 to 4 carbon atoms and $R^3$ and $R^4$ are each a hydrogen atom, a hydroxyl group or an alkoxy group having 1 to 4 carbon atoms, as a crosslinking agent.

In addition to the above defined essential ingredients, the composition can further contain (D) from 0.01 to 1.0 part by weight of an aliphatic amine compound and/or (E) from 0.01 to 1.0 part by weight of a carboxylic acid.

The invention also provides a photosensitive patterning material which is an integral layered body comprising (a) a substrate, (b) a layer of an organic anti-reflection composition formed on the surface of the substrate having a thickness of 30 to 300 nm and (c) a photoresist layer formed on the anti-reflection film from the negative-working photoresist composition defined above having a thickness of 200 to 500 nm.

DETAILED DESCRIPTION OF THE PREFERRED EMBODIMENTS

As is described above, the essential ingredients in the negative-working photoresist composition of the invention include the alkali-soluble resin as the component (A), an onium salt compound as the component (B) which is an acid-generating agent and a specific ethyleneurea compound as the component (C) which is a crosslinking agent for the component (A).

This unique formulation of the photoresist composition has been established as a result of the extensive investigations undertaken by the inventors with an object to develop a photosensitive patterning material of which the total thickness of a negative-working photoresist layer and an organic anti-reflection film does not exceed 800 nm leading to an unexpected discovery that this object can well be accomplished by a negative-working photoresist composition of the above mentioned formulation.

The component (A) in the inventive negative-working photoresist composition is an alkali-soluble resinous compound which is not particularly limitative and can be selected from a variety of alkali-soluble resins conventionally used in chemical-amplification photoresist compositions. Examples of alkali-soluble resinous compound particularly preferable from the standpoint of obtaining a patterned resist layer having excellent photosensitivity, pattern resolution and cross sectional profile of the patterned resist layer include copolymeric resins having a weight-average molecular weight of 2000 to 4000 and consisting of 60 to 97% by moles of hydroxystyrene units and 40 to 3% by moles of styrene units, copolymeric resins having a weight-average molecular weight of 2000 to 4000 and consisting of 60 to 97% by moles of hydroxystyrene units and 40 to 3% by moles of styrene units, of which from 5 to 30% of the hydroxyl groups in the hydroxystyrene units are substituted by alkali-insoluble groups and polyhydroxystyrene resins having a weight-average molecular weight of 2000 to 4000, of which from 3 to 40% of the hydroxyl groups in the hydroxystyrene units are substituted by alkali-insoluble groups. More preferably, the alkali-soluble resin as the component (A) is a copolymeric resin having a weight-average molecular weight of 2000 to 4000 and consisting of 60 to 97% by moles of hydroxystyrene units and 40 to 3% by moles of styrene units when excellent orthogonality of the cross sectional profile of the patterned resist layer is essential.

The alkali-insoluble group mentioned above is a group which has an effect to decrease the alkali-solubility of a basically alkali-soluble resin when the resin is substituted by such groups. Examples of the alkali-insoluble group suitable for the purpose include tertiary-alkoxycarbonyl groups such as tert-butoxycarbonyl group and tert-amyloxycarbonyl group and lower alkyl groups having 1 to 4 carbon atoms such as methyl group, ethyl group, propyl group, isopropyl group, n-butyl group and isobutyl group, of which the lower alkyl group or, in particular, isopropyl group is preferable in view of obtaining a good patterned resist layer under little influences by the ambient conditions.

The acid-generating agent as the component (B) in the inventive photoresist composition is a compound capable of releasing an acid by decomposition under irradiation with actinic rays. While a variety of radiation-sensitive acid-generating compounds are known and used in chemical-amplification photoresist compositions, the component (B) in the inventive photoresist composition is a specific onium salt compound selected from the group consisting of iodonium salt compounds and sulfonium salt compounds, of which the anionic moiety is a fluoroalkyl sulfonate anion. Such an onium salt compound is a known compound as disclosed in Japanese Patent Kokai 54-95686, 62-229942 and 2-120366 and elsewhere.

It is taught in Japanese Patent Publication 8-3635 that a preferable acid-generating agent in a negative-working photoresist composition for pattern-wise exposure with a KrF excimer laser beam is tris(2,3-dibromopropyl) isocyanurate because this compound has an advantage of high transparency to the KrF excimer laser beams and high pattern resolution of the patterned resist layer obtained by using this compound as the acid-generating agent.

This compound, from which a halogenoacid is generated by irradiation with actinic rays, however, is not suitable for use in a photoresist composition containing an ethyleneurea compound as a crosslinking agent because the effective photosensitivity of the photoresist composition cannot be high enough as to be applicable to an actual production line of LSIs.

Besides the above named halogenoacid-generating compound, sulfonic acid-generating compounds, such as bis(cyclohexylsulfonyl) diazomethane, are also known and used as an acid-generating agent in chemical-amplification photoresist compositions. These compounds are also not suitable for use in combination with an ethyleneurea compound because a patterned resist layer of high pattern resolution can hardly be obtained with a photoresist composition formulated with these compounds as the acid-generating agent and crosslinking agent.

It is the unexpected discovery leading to the present invention that the above described various problems can be overcome by combining a specific onium salt compound as the acid-generating agent and a specific ethyleneurea compound as the crosslinking agent in a negative-working photoresist composition to give a patterned resist layer of excellent properties.

The anionic moiety of the onium salt compound as the component (B) is a fluoroalkyl sulfonate anion. The fluoroalkyl group thereof can be a partially fluorinated or fully fluorinated alkyl group. The number of carbon atoms in the fluoroalkyl group is not particularly limitative. It is preferable, however, that the fluoroalkyl group is a perfluoroalkyl group having 1 to 10 carbon atoms because of the general trend that the acid strength of the fluoroalkyl sulfonic acid is increased as the degree of fluorination of the fluoroalkyl group is increased and the number of carbon atoms in the fluoroalkyl group is relatively small not to exceed 10.

On the other hand, the cationic moiety as the counterpart of the fluoroalkyl sulfonate anion to form the onium salt compound as the component (B) is selected from the group consisting of iodonium cations and sulfonium cations. Examples of suitable cations include diphenyliodonium cations and triphenylsulfonium cations optionally substituted by one or more of lower alkyl groups such as methyl, ethyl, propyl, n-butyl and tert-butyl groups, di(lower alkyl) monophenylsulfonium cations, lower alkylcyclohexyl 2-oxocyclohexylsulfonium cations and the like.

Examples of particularly preferable cations include diphenyliodonium cations represented by the general formula

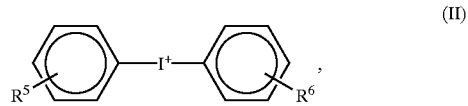

(II)

in which $R^5$ and $R^6$ are each a hydrogen atom, alkyl group having 1 to 4 carbon atoms or alkoxy group having 1 or 2 carbon atoms, such as diphenyliodonium and bis(4-tert-butylphenyl) iodonium cations, triphenylsulfonium cations represented by the general formula

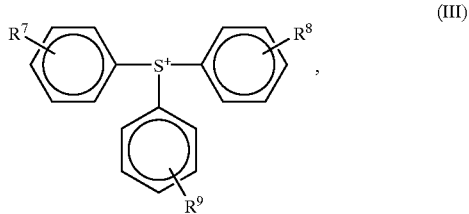

(III)

in which $R^7$, $R^8$ and $R^9$ are each a hydrogen atom, alkyl group having 1 to 4 carbon atoms or alkoxy group having 1 or 2 carbon atoms, such as triphenylsulfonium, tris(4-methyl-phenyl)sulfonium and tris(4-methoxyphenyl) sulfonium cations, phenyl dialkylsulfonium cations represented by the general formula

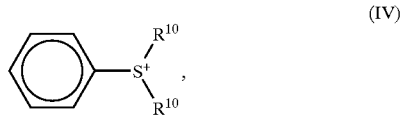

(IV)

in which each $R^{10}$ is an alkyl group having 1 to 4 carbon atoms, such as dimethylphenylsulfonium cations and alkyl cyclohexyl 2-oxocyclohexyl sulfonium cations represented by the general formula

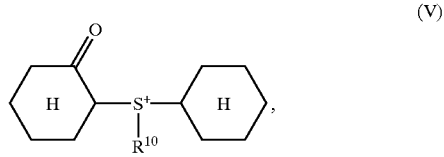

(V)

in which $R^{10}$ has the same meaning as defined above, such as methyl cyclohexyl 2-oxocyclohexylsulfonium cation.

The onium salt compounds particularly preferable as the component (B) in the inventive photoresist composition are those formed from these cations and trifluoromethane sulfonate or nonafluorobutane sulfonate anion or, more preferably, those formed from the triphenylsulfonium cation expressed by the above given general formula (III) and trifluoromethane sulfonate or nonafluorobutane sulfonate anion. These onium salt compounds can be used either singly or as a combination of two kinds or more.

The amount of the onium salt compound as the component (B) in the inventive photoresist composition is in the range from 0.5 to 20 parts by weight per 100 parts by weight of the alkali-soluble resin as the component (A). When the amount of the component (B) is too small, the photosensitivity of the photoresist composition cannot be high enough. When the amount of the component (B) is too large, on the other hand, the photoresist composition suffers a decrease in the focusing depth latitude or in the storage stability.

The third essential ingredient in the inventive photoresist composition is the component (C) which is an ethyleneurea compound represented by the general formula (I) to serve as a crosslinking agent of the resinous ingredient as the component (A). The compound of the general formula (I) is an ethyleneurea compound substituted at one or both of the N-atoms by a crosslink-forming group or groups selected from hydroxyalkyl groups and lower alkoxyalkyl groups or an ethyleneurea compound substituted at the 4- or 5-position thereof by a hydroxyl group or a lower alkoxy group.

While it is a conventional formulation of negative-working chemical-amplification photoresist compositions that an alkoxymethylated melamine or an alkoxymethylated urea is used as the crosslinking agent, these conventional crosslinking agents have a problem that the crosslinking activity thereof is too high so that, when extremely fine patterning is desired of the photoresist composition, the temperature range for the post-exposure baking treatment is narrowly limited and, when the photoresist layer is formed on an organic anti-reflection film, the cross sectional profile of the patterned resist layer cannot be excellently orthogonal but appearance of skirt trailing or downward narrowing is sometimes unavoidable in the cross sectional profile of the patterned resist layer.

The ethyleneurea compound of the general formula (I) used as the crosslinking agent, i.e. component (C) in the inventive photoresist composition, has only a small number of the crosslinkable groups per molecule so that the crosslinking activity of the crosslinking agent is moderately low. When such a crosslinking agent is used in combination with a specific onium salt compound as the acid-generating agent, the above described problems encountered in the use of the conventional crosslinking agent can mostly be overcome. In addition, unexpected advantages can be obtained by the use of the specific ethyleneurea compound as the crosslinking agent that the alkali-solubility of the resist layer in the areas unexposed to the actinic rays is increased so that formation of an isolated resist pattern can be performed with a decreased amount of scum formation in the development treatment.

The ethyleneurea compound represented by the general formula (I) can be easily prepared by the condensation reaction of ethyleneurea with formaldehyde to give a condensation product which can optionally be alkoxylated by the reaction with a lower alcohol.

Examples of the ethyleneurea compounds suitable as the crosslinking agent in the inventive photoresist composition include dihydroxymethyl ethyleneurea, dimethoxymethyl ethyleneurea, diethoxymethyl ethyleneurea, dipropoxymethyl ethyleneurea, dibutoxymethyl ethyleneurea, 1,3-di(methoxy-methyl) 4,5-dihydroxy 2-imidazolidinone, 1,3-di(methoxymethyl) 4,5-dimethoxy 2-imidazolidinone and the like. These ethyleneurea compounds are commercially available in the form of a mixture of the monomer, dimer and trimer (MX-280, a product by Sanwa Chemical Co.).

The amount of the ethyleneurea compound as the component (C) in the inventive photoresist composition is in the range from 3 to 50 parts by weight or, preferably, from 10 to 20 parts by weight per 100 parts by weight of the component (A). When the amount of the component (C) is too small, the crosslink formation of the resinous ingredient cannot proceed completely resulting in poor properties of the patterned resist layer. When the amount of the component (C) is too large, the photoresist composition suffers a decrease in the storage stability or decrease in the photosensitivity with eventual formation of a particulate matter during storage.

In addition to the above described essential ingredients, i.e. components (A), (B) and (C), it is optional that the inventive photoresist composition is admixed with an aliphatic lower-alkyl or -alkanol amine compound as the component (D) and/or a carboxylic acid or an oxoacid of phosphorus as well as an ester thereof as the component (E). These additional ingredients are known and conventionally employed in negative-working chemical-amplification photoresist compositions in the prior art.

Examples of the above mentioned aliphatic amine compound as the component (D) include tertiary amines such as trimethylamine, triethylamine, tripropylamine, tributylamine, tripentylamine, triethanolamine and tripropanolamine and secondary amines such as dipropylamine, dibutylamine, dipentylamine and dipropanolamine.

The amount of the component (D) in the inventive photoresist composition, when added, is in the range from 0.01 to 1.0 part by weight per 100 parts by weight of the component (A).

Examples of preferable carboxylic acids as the component (E) in the inventive photoresist composition include malonic acid, citric acid, malic acid, succinic acid, benzoic acid and salicylic acid.

Examples of the oxoacid of phosphorus or a ester thereof as the other class of the component (E) include phosphoric and phosphorous acids and esters thereof such as phosphoric acid, phosphorous acid, di(n-butyl) phosphate and diphenyl phosphate, phosphonic acid and esters thereof such as phosphonic acid, dimethyl phosphonate, di(n-butyl) phosphonate, phenyl phosphonate, diphenyl phosphonate and dibenzyl phosphonate and phosphinic acid and esters thereof such as phosphinic acid and phenyl phosphinate.

The amount of the component (E) in the inventive photoresist composition, when added, is in the range from 0.01 to 1.0 part by weight per 100 parts by weight of the component (A).

It is optional that the inventive photoresist composition is admixed with the component (D) alone, component (E) alone or both of the components (D) and (E) in combination.

The photoresist composition of the present invention is prepared usually in the form of a uniform solution by dissolving the above described essential ingredients and optional ingredients in an organic solvent which is not particularly limitative provided that the solubility of each ingredient therein is high enough. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more. It is preferable that the organic solvent is a mixture of propyleneglycol monomethyl ether and propyleneglycol monomethyl ether acetate in a mixing proportion of 50:50 to 80:20 by weight in consideration of the good solubility behavior to the components (B) and (C).

Various further additives can optionally be added to the inventive photoresist composition including, for example, surface active agents having effectiveness to improve the film-forming properties of the photoresist composition in the formation of a photoresist layer.

The present invention further provides a photosensitive patterning material which is an integrally layered body comprising (a) a substrate plate, (b) an organic anti-reflection film formed on the surface of the substrate plate and (c) a photoresist layer formed on the anti-reflection film from the above described negative-working photoresist composition of the invention described above.

A variety of substrate plates can be used without particular limitations depending on the intended application. Typical examples of applicable substrate materials include semiconductor silicon wafers with or without an undercoating film of SiON, SiN, $Si_3N_4$, polycrystalline silicon and TiN and glass plates having a coating film of a metal such as tantalum and chromium.

The anti-reflection film formed on one surface of the substrate is limited to a water-insoluble organic anti-reflection film which is formed, different from an inorganic anti-reflection film usually formed by the chemical vapor-phase deposition (CVD) method of an inorganic material, by coating the substrate surface with a coating solution containing an organic ultraviolet absorbing polymeric compound in an organic solvent followed by drying and a heat treatment. Several commercial products of an organic anti-reflection coating solution are available including a product sold under the trade name of DUV-42 (a product by Brewer Science Co.).

The organic anti-reflection coating film is formed on the substrate surface in a thickness in the range from 30 to 300 nm. This thickness of the anti-reflection film as well as the thickness of the photoresist layer formed thereon are each an important factor affecting the quality of the patterned resist layer relative to the pattern resolution and orthogonality of the cross sectional profile thereof. In this regard, the photoresist layer formed from the inventive photoresist composition should have a thickness in the range from 200 to 700 nm or, preferably, from 200 to 500 nm or, more preferably, from 200 to 400 nm. When the thickness of the photoresist layer deviates out of the range, satisfactory quality of the patterned resist layer cannot be ensured relative to the dimensional accuracy and orthogonality of the cross sectional profile to negate the advantages to be obtained by the combined use of the specific components (B) and (C).

It is further optional that an additional anti-reflection coating film, which must be soluble in water, is formed on the photoresist layer in a thickness of 35 to 45 nm.

In the following, the present invention is described in more detail by way of Examples. In the following description, the term of "parts" always refers to "parts by weight".

EXAMPLE 1

A negative-working photoresist composition was prepared by dissolving, in a solvent mixture of 700 parts of propylene-glycol monomethyl ether and 300 parts of propyleneglycol monomethyl ether acetate:

100 parts of a copolymeric resin having a weight-average molecular weight of 2500 and consisting of 95% by moles of hydroxystyrene units and 5% by moles of styrene units as the component (A);

3 parts of triphenylsulfonium trifluoromethane sulfonate as the component (B);

10 parts of MX-280 (supra) containing 90% by weight of dimethoxymethylated ethyleneurea as the component (C);

0.2 part of tributylamine as the component (D);

0.2 part of salicylic acid as the component (E); and a fluorosilicone-based surface active agent (X-70-093, a product by Shin-Etsu Chemical Co.) in an amount of 700 ppm by weight based on the total amount of the non-volatile ingredients, followed by filtration of the solution through a membrane filter of 200 nm pore diameter.

Separately, a 6-inch semiconductor silicon wafer was coated on one surface with an organic anti-reflection coating solution (DUV-42, supra) followed by drying and a heat treatment at 180° C. for 60 seconds to form an anti-reflection coating film of 80 nm thickness.

The negative-working photoresist solution prepared above was applied onto the anti-reflection coating film on a spinner rotating at 2500 rpm for 30 seconds followed by drying on a hot plate at 90° C. for 60 seconds to give a photoresist layer having a thickness of 500 nm.

The thus formed photoresist layer was pattern-wise exposed to KrF excimer laser beams on a minifying projection exposure machine (Model FPA-3000EX3, manufactured by Canon Co.) followed by a post-exposure baking (PEB) treatment at 110° C. for 60 seconds and then subjected to a development treatment as a puddle development with a 2.38% by weight aqueous solution of tetramethylammonium hydroxide at 23° C. for 60 seconds followed by rinse for 15 seconds in a running stream of pure water and drying to give a negatively patterned resist layer.

The critical resolution of the line-and-space patterned resist layer was 180 nm. The cross sectional profile of the line-patterned resist layer of the critical resolution was excellently orthogonal standing upright on the substrate surface without skirt trailing in the vicinity of the interface with the anti-reflection film.

The minimum exposure dose for obtaining a patterned resist layer of 180 nm line width was 40 mJ/cm$^2$ which was taken as a measure of the photosensitivity of the photoresist composition.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 2

A negative-working photoresist composition was prepared in the same formulation as in Example 1 except that the triphenylsulfonium trifluoromethane sulfonate was replaced with the same amount of dimethyl phenyl sulfonium trifluoromethane sulfonate.

The same patterning procedure as in Example 1 was under-taken by using the thus prepared photoresist composition to find that the critical pattern resolution was for a line-and-space pattern of 180 nm line width and the photosensitivity therefor was 50 mJ/cm$^2$. The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 3

A negative-working photoresist composition was prepared in the same formulation as in Example 1 except that the alkali-soluble resin as the component (A) was replaced with the same amount of a polyhydroxystyrene resin having a weight-average molecular weight of 3000, of which 20% of the hydroxyl groups were substituted by isopropyl groups as an alkali-insoluble group.

The same patterning procedure as in Example 1 was under-taken by using the thus prepared photoresist composition to find that the critical pattern resolution was for a line-and-space pattern of 180 nm line width and the photosensitivity therefor was 30 mJ/cm$^2$. The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 4

A negative-working photoresist composition was prepared in the same formulation as in Example 1 except that the dimethoxymethylated ethyleneurea as the component (C) was replaced with the same amount of dibutoxymethylated ethyleneurea.

The same patterning procedure as in Example 1 was under-taken by using the thus prepared photoresist composition to find that the critical pattern resolution was for a line-and-space pattern of 180 nm line width and the photosensitivity therefor was 45 mJ/cm$^2$. The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 5

The formulation of the negative working photoresist composition was the same as in Example 1 except that the solvent used here was a mixture of 1050 parts of propyleneglycol monomethyl ether and 450 parts of propyleneglycol monomethyl ether acetate. The procedure for the patterning test with the thus prepared photosensitive composition was also the same as in Example 1 except that the photoresist layer formed on the anti-reflection film had a thickness of 300 nm instead of 500 nm.

The results of the patterning test were that the critical pattern resolution was 150 nm and the minimum exposure dose for obtaining a line-patterned resist layer of 150 nm line width was 40 mJ/cm$^2$. The cross sectional profile of the patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 6

A negative-working photoresist composition was prepared in the same formulation as in Example 5 except that the alkali-soluble resin as the component (A) was replaced with the same amount of a polyhydroxystyrene resin having a weight-average molecular weight of 3000, of which 20% of the hydroxyl groups were substituted by isopropyl groups as an alkali-insoluble group.

The same patterning procedure as in Example 5 was under-taken by using the thus prepared photoresist composition to find that the critical pattern resolution was for a line-and-space pattern of 150 nm line width and the photosensitivity therefor was 35 mJ/cm$^2$. The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 7

A negative-working photoresist composition was prepared in the same formulation as in Example 5 except that the dimethoxymethylated ethyleneurea as the component (C) was replaced with the same amount of dibutoxymethylated ethyleneurea.

The same patterning procedure as in Example 1 was undertaken by using the thus prepared photoresist composition to find that the critical pattern resolution was for a line-and-space pattern of 150 nm line width and the photosensitivity therefor was 40 mJ/cm$^2$. The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 8

The same experimental procedure as in Example 1 was undertaken except that the anti-reflection film was omitted and the post-exposure baking treatment was undertaken at 110° C. for 90 seconds instead of 60 seconds.

The critical pattern resolution was for a line-and-space pattern of 200 nm line width and the photosensitivity therefor was 20 mJ/cm$^2$.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 9

A 6-inch semiconductor silicon wafer was provided on one surface, in the same manner as in Example 1, successively with an organic anti-reflection film of 80 nm thickness and a negative-working photoresist layer of 500 nm thickness with the same photoresist solution.

The photoresist layer on the substrate surface was further coated with an aqueous anti-reflection coating solution (TSP-9AEX, a product by Tokyo Ohka Kogyo Co.) followed by drying to form a second anti-reflection film having a thickness of 42 nm, which was water-soluble.

The same patterning test as in Example 1 was undertaken for the above obtained photoresist layer sandwiched between two anti-reflection films.

The critical pattern resolution was for a line-and-space pattern of 180 nm line width and the photosensitivity therefor was 40 mJ/cm$^2$. The cross sectional profile of the line-patterned resist layer was excellently orthogonal standing upright on the substrate surface without skirt trailing in the vicinity of the interface with the water-insoluble anti-reflection film and without T-formed broadening at the top portion which had been in contact with the water-soluble anti-reflection coating film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 10

The same experimental procedure as in Example 1 was undertaken except that the resinous ingredient as the component (A) was a copolymeric resin consisting of 80% by moles of hydroxystyrene units and 20% by moles of styrene units and having a weight-average molecular weight of 2500 and the component (B) was dimethyl phenyl sulfonium trifluoromethane sulfonate and 0.2 part of phosphonic acid was additionally admixed as the component (E).

The critical pattern resolution was for a line-and-space pattern of 180 nm line width and the photosensitivity therefor was 40 mJ/cm$^2$. The cross sectional profile of the line-patterned resist layer was excellently orthogonal standing upright on the substrate surface without skirt trailing in the vicinity of the interface with the water-insoluble anti-reflection film.

Further, the same patterning procedure as above was repeated except that the temperature of the post-exposure baking treatment was varied to find that the line width of the resist pattern formed thereby was varied by 1 nm per degree centigrade of the temperature change.

COMPARATIVE EXAMPLE 1

The formulation of the negative-working photoresist solution was the same as in Example 1 except that the components (B) and (C) were replaced with 5 parts of tris(2,3-dibromopropyl) isocyanurate and 10 parts of methoxymethylated urea (MX-290, a product by Sanwa Chemical Co.), respectively.

A patterning test was undertaken in the same manner as in Example 1 by using the above prepared photoresist solution to obtain the results that the critical pattern resolution was for a line-and-space pattern of 200 nm line width and the photosensitivity therefor was 100 mJ/cm$^2$. The cross sectional profile of the patterned resist layer had trailing skirts at the interface with the anti-reflection coating film below.

Further, the same patterning procedure as above was repeated except that the temperature of the post-exposure baking treatment was varied to find that the line width of the resist pattern formed thereby was varied by 10 nm per degree centigrade of the temperature change.

COMPARATIVE EXAMPLE 2

The formulation of the negative-working photoresist solution was the same as in Example 1 except that the component (B) was replaced with 5 parts of tris(2,3-dibromopropyl) isocyanurate.

A test patterning procedure was undertaken in the same manner as in Example 1 with the thus prepared photoresist solution but failed to give a patterned resist layer.

COMPARATIVE EXAMPLE 3

The formulation of the negative-working photoresist solution was the same as in Example 1 except that the component (B) was replaced with 5 parts of bis(cyclohexylsulfonyl) diazomethane.

A patterning test was undertaken in the same manner as in Example 1 by using the above prepared photoresist solution to obtain the results that the critical pattern resolution was for a line-and-space pattern of 300 nm line width and the photosensitivity therefor was 50 mJ/cm$^2$. The cross sectional profile of the patterned resist layer had trailing skirts in the vicinity of the interface with the anti-reflection coating film below.

Further, the same patterning procedure as above was repeated except that the temperature of the post-exposure baking treatment was varied to find that the line width of the resist pattern formed thereby was varied by 10 nm per degree centigrade of the temperature change.

EXAMPLE 11

A negative-working photoresist composition was prepared in the same formulation as in Example 1 except that the triphenylsulfonium trifluoromethane sulfonate as the component (B) was replaced with the same amount of bis(4-tert-butylphenyl) iodonium trifluoromethane sulfonate.

The same patterning procedure as in Example 1 was undertaken by using the thus prepared photoresist composition to find that the critical pattern resolution was for a line-and-space pattern of 170 nm line width and the photosensitivity therefor was 35 mJ/cm². The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 12

A negative-working photoresist composition was prepared in the same formulation as in Example 1 except that the triphenylsulfonium trifluoromethane sulfonate as the component (B) was replaced with the same amount of diphenyliodonium trifluoromethane sulfonate.

The same patterning procedure as in Example 1 was undertaken by using the thus prepared photoresist composition to find that the critical pattern resolution was for a line-and-space pattern of 170 nm line width and the photosensitivity therefor was 35 mJ/cm². The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 13

A negative-working photoresist composition was prepared in the same formulation as in Example 1 except that the triphenylsulfonium trifluoromethane sulfonate as the component (B) and MX-280 as the component (C) were replaced each with the same amount of bis(4-tert-butylphenyl) iodonium trifluoromethane sulfonate and dibutoxymethyl ethyleneurea, respectively.

The same patterning procedure as in Example 1 was undertaken by using the thus prepared photoresist composition to find that the critical pattern resolution was for a line-and-space pattern of 180 nm line width and the photosensitivity therefor was 40 mJ/cm². The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 14

A negative-working photoresist composition was prepared in the same formulation as in Example 3 except that the triphenylsulfonium trifluoromethane sulfonate as the component (B) was replaced with the same amount of bis(4-tert-butylphenyl) iodonium trifluoromethane sulfonate.

The same patterning procedure as in Example 1 was under-taken by using the thus prepared photoresist composition to find that the critical pattern resolution was for a line-and-space pattern of 170 nm line width and the photosensitivity therefor was 25 mJ/cm². The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

EXAMPLE 15

A negative-working photoresist composition was prepared in the same formulation as in Example 11 except that the component (A) was, in place of the hydroxystyrene-styrene copolymer as used in Example 1 alone, a 90:10 by weight combination of the same copolymer and a novolak resin.

The same patterning procedure as in Example 1 was under-taken by using the thus prepared photoresist composition to find that the critical pattern resolution was for a line-and-space pattern of 180 nm line width and the photosensitivity therefor was 40 mJ/cm². The cross sectional profile of the line-patterned resist layer was excellently orthogonal standing upright on the substrate surface without skirt trailing in the vicinity of the interface with the anti-reflection film.

Further, the same patterning procedure as above was repeated except that the temperature of the post-exposure baking treatment was varied to find that the line width of the resist pattern formed thereby was varied by 1 nm per degree centigrade of the temperature change.

What is claimed is:

1. A negative-working photoresist composition which comprises, as a uniform solution in an organic solvent:
   (A) 100 parts by weight of an alkali-soluble resin which is a copolymer of hydroxystyrene and styrene consisting of from 60 to 97% by moles of hydroxystyrene units and from 40 to 3% by moles of styrene units, a copolymer of hydroxystyrene and styrene consisting of from 60 to 97% by moles of hydroxystyrene units and from 40 to 3% by moles of styrene units substituted by alkali-insoluble groups for from 5 to 30% of the hydroxyl groups or a polyhydroxystyrene substituted by alkali-insoluble groups for from 3 to 40% of the hydroxyl groups;
   (B) from 0.5 to 20 parts by weight of an onium salt compound selected from the group consisting of iodonium salt compounds and sulfonium salt compounds, of which the anionic moiety is a fluoroalkyl sulfonate anion as a radiation-sensitive acid-generating agent; and
   (C) from 3 to 50 parts by weight of an ethyleneurea compound represented by the general formula

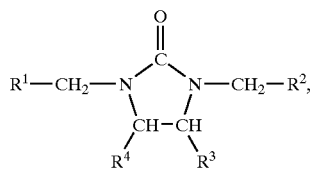

in which $R^1$ and $R^2$ are each a hydroxyl group or an alkoxy group having 1 to 4 carbon atoms and $R^3$ and $R^4$ are each a hydrogen atom, a hydroxyl group or an alkoxy group having 1 to 4 carbon atoms, as a crosslinking agent.

2. The negative-working photoresist composition as claimed in claim 1 in which the fluoroalkyl sulfonate anion in the component (B) is a perfluoroalkyl sulfonate anion having 1 to 10 carbon atoms.

3. The negative-working photoresist composition as claimed in claim 1 in which the alkali-insoluble group is an alkyl group having 1 to 4 carbon atoms.

4. The negative-working photoresist composition as claimed in claim 1 in which at least one of the groups denoted by $R^1$ and $R^2$ is an alkoxy group having 1 to 4 carbon atoms, the rest, if any, being a hydroxyl group, and the groups denoted by $R^3$ and $R^4$ are each a hydrogen atom.

5. The negative-working photoresist composition as claimed in claim 1 which further comprises: (E) from 0.01 to 1.0 part by weight of a carboxylic acid per 100 parts by weight of the component (A).

6. The negative-working photoresist composition as claimed in claim 5 in which the component (E) is selected from the group consisting of malonic acid, citric acid, malic acid, succinic acid, benzoic acid and salicylic acid.

7. The negative-working photoresist composition as claimed in claim 1 in which the organic solvent is a mixture of propyleneglycol monomethyl ether and propyleneglycol monomethyl ether acetate in a mixing ratio in the range from 50:50 to 80:20 by weight.

8. A photosensitive material for patterning of a photoresist layer which comprises, as an integral layered body:
(a) a substrate;
(b) a water-insoluble organic anti-reflection coating film formed on the surface of the substrate; and
(c) a photoresist layer formed on the anti-reflection coating film from a photoresist composition as defined in claim 1.

9. The photosensitive material for patterning of a photoresist layer as claimed in claim 8 in which the anti-reflection coating film has a thickness in the range from 30 to 300 nm.

10. The photosensitive material for patterning of a photoresist layer as claimed in claim 8 in which the photoresist layer has a thickness in the range from 200 to 500 nm.

11. The photosensitive material for patterning of a photoresist layer as claimed in claim 8 which further comprises: (d) a water-soluble anti-reflection coating film formed on the photoresist layer.

12. The photosensitive material for patterning of a photoresist layer as claimed in claim 11 in which the water-soluble anti-reflection coating film has a thickness in the range from 35 to 45 nm.

13. A negative-working photoresist composition which comprises, as a uniform solution in an organic solvent:
(A) 100 parts by weight of an alkali-soluble resin;
(B) from 0.5 to 20 parts by weight of an onium salt compound selected from the group consisting of iodonium salt compounds and sulfonium salt compounds, of which the anionic moiety is a fluoroalkyl sulfonate anion as a radiation-sensitive acid-generating agent;
(C) from 3 to 50 parts by weight of an ethyleneurea compound represented by the general formula

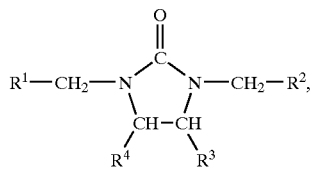

in which $R^1$ and $R^2$ are each a hydroxyl group or an alkoxy group having 1 to 4 carbon atoms and $R^3$ and $R^4$ are each a hydrogen atom, a hydroxyl group or an alkoxy group having 1 to 4 carbon atoms, as a crosslinking agent and (D) from 0.01 to 1.0 part by weight of an aliphatic amine compound per 100 parts by weight of the component (A).

14. The negative-working photoresist composition as claimed in claim 13 in which the fluoroalkyl sulfonate anion in the component (B) is a perfluoroalkyl sulfonate anion having 1 to 10 carbon atoms.

15. The negative-working photoresist composition as claimed in claim 13 in which the alkali-insoluble group is an alkyl group having 1 to 4 carbon atoms.

16. The negative-working photoresist composition as claimed in claim 13 in which at least one of the groups denoted by $R^1$ and $R^2$ is an alkoxy group having 1 to 4 carbon atoms, the rest, if any, being a hydroxyl group, and the groups denoted by $R^3$ and $R^4$ are each a hydrogen atom.

17. The negative-working photoresist composition as claimed in claim 13 in which the aliphatic amine compound is selected from the group consisting of trialkyl amine compounds, dialkyl amine compounds, trialkanol amine compounds and dialkanol amine compounds, of which the alkyl group or alkanol group has 1 to 5 carbon atoms.

18. The negative-working photoresist composition as claimed in claim 13 which further comprises: (E) from 0.01 to 1.0 part by weight of a carboxylic acid per 100 parts by weight of the component (A).

19. The negative-working photoresist composition as claimed in claim 18 in which the component (E) is selected from the group consisting of malonic acid, citric acid, malic acid, succinic acid, benzoic acid and salicylic acid.

20. The negative-working photoresist composition as claimed in claim 13 in which the organic solvent is a mixture of propyleneglycol monomethyl ether and propyleneglycol monomethyl ether acetate in a mixing ratio in the range from 50:50 to 80:20 by weight.

21. A photosensitive material for patterning of a photoresist layer which comprises, as an integral layered body:
(a) a substrate;
(b) a water-insoluble organic anti-reflection coating film formed on the surface of the substrate; and
(c) a photoresist layer formed on the anti-reflection coating film from a photoresist composition as defined in claim 13.

22. The photosensitive material for patterning of a photoresist layer as claimed in claim 21 in which the anti-reflection coating film has a thickness in the range from 30 to 300 nm.

23. The photosensitive material for patterning of a photoresist layer as claimed in claim 21 in which the photoresist layer has a thickness in the range from 200 to 500 nm.

24. The photosensitive material for patterning of a photoresist layer as claimed in claim 21 which further comprises: (d) a water-soluble anti-reflection coating film formed on the photoresist layer.

25. The photosensitive material for patterning of a photoresist layer as claimed in claim 24 in which the water-soluble anti-reflection coating film has a thickness in the range from 35 to 45 nm.

* * * * *